United States Patent
Xin et al.

(10) Patent No.: US 6,268,818 B1
(45) Date of Patent: Jul. 31, 2001

(54) METHOD AND APPARATUS FOR IMPROVING MODULATION ACCURACY

(75) Inventors: Weizhuang Xin, Aliso Viejo; Ganning Yang, Irvine, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/103,418

(22) Filed: Jun. 24, 1998

(51) Int. Cl.[7] .................................................. H03M 1/82
(52) U.S. Cl. ............................ 341/152; 341/144; 341/143
(58) Field of Search ................................... 341/152, 144, 341/143; 363/157

(56) References Cited

U.S. PATENT DOCUMENTS

| | | | |
|---|---|---|---|
| 3,987,280 | * 10/1976 | Bauer | 341/144 |
| 4,618,818 | * 10/1986 | Horn | 324/706 |
| 4,675,881 | * 6/1987 | Chung | 375/322 |
| 4,855,894 | 8/1989 | Asahi et al. | 363/157 |
| 5,805,619 | * 9/1998 | Gardner et al. | 375/376 |

FOREIGN PATENT DOCUMENTS 0 817 369 A2    1/1998   (EP) .

OTHER PUBLICATIONS

Bjorn Bjerede, Joseph Lipowski, James Petranovich, Sheldon Gilbert An Intermediate Frequency Modulator using Direct Digital Synthesis Techniques for Japanese Personal Handy Phone (PHP) and Digital European Cordless Telecommunications (DECT), p. 467–471, 1994 IEEE 44th Vehicular Technology Conference; Jun. 8–10, 1994.

Tetsu Sakata, Kazuhiko Seki, Shuji Kubota and Shuzo Kato, A New Fully–Digitalized π/4–Shift QPSK Modulator for Personal Communication Terminals, p. 921–926, IEICE Trans. Commun., vol. E77–B, No. 7; Jul. 1994.

Chapter 8 "Sampling", source unknown no date.

Emmanuel C. Ifeachor & Barrie W. Jervis, *Digital Signal Processing A Practical Approach* (Addison–Wesley 1993).

Anonymous, "PulseFiltering for D/A Converter", IBM Technical Disclosure Bulletin, vol. 28, No. 2, pp. 539–541, Jul. 1985 International Search Report.

* cited by examiner

Primary Examiner—Peguy Jeanpierre
Assistant Examiner—Jean B. Jeanglaude
(74) Attorney, Agent, or Firm—Knobbe, Martens, Olson & Bear, LLP

(57) ABSTRACT

A system for digital-to-analog conversion and up-conversion (frequency multiplication) that reduces the distortion and attenuation caused by the sinc effect is described. The shape of the sinc function that gives rise to the sinc effect is altered in a manner such that the distortion produced by the sinc effect is reduced. The output of a digital-to-analog converter is provided with a return-to-zero (RTZ) output such that the digital-to-analog converter produces output pulses rather than output levels as would be expected from a conventional sample-and-hold output. The use of output pulses pushes the first null of the sinc function to a relatively higher frequency and thus the sinc function does not produce as much distortion in the harmonics of the sampled signal. Since the harmonics are less distorted, a bandpass filter or other filter can be used to extract harmonics of the sampled signal rather than the fundamental frequency. In this manner, the digital-to-analog converter and filter together provide digital-to-analog conversion and frequency multiplication (up-conversion).

10 Claims, 12 Drawing Sheets

METHOD AND APPARATUS FOR IMPROVING MODULATION ACCURACY

BACKGROUND OF THE INVENTION

1. Field of the Invention

This invention relates generally to digital signal processing and digital communications, and more specifically to modulation using digital-to-analog converters and frequency multipliers.

2. Description of the Related Art

It has become increasingly important to reduce the size, weight, and power consumption of electronic devices, especially personal communication devices such as cellular telephones. Consumers want devices that are easily carried around and have long battery life. Electronics manufacturers have therefore sought to reduce the number of components in electronic devices by using components that perform multiple finctions.

Modulation is a function that is often performed in consumer devices. This is especially true for consumer devices that transmit signals over long distances, devices that transmit or store data represented as digital signals, and all types of telecommunication devices. Data signals are rarely transmitted over a distance in their raw form. The signals are normally modulated to match their frequency characteristics to those of the transmission medium in order to minimize signal distortion, to use the available bandwidth efficiently, and to ensure that the signals have some desirable properties. The process of modulation often involves modifying a high frequency signal, known as the carrier signal, in sympathy with a data signal, called the modulating (or baseband) signal. For convenience, persons skilled in the art typically categorize modulation into one of two categories.

The first modulation category is called data modulation. Data modulation refers to the process used when encoding a stream of data (often referred to as a baseband signal) into a carrier signal. The way in which the carrier signal is encoded is called the modulation scheme. Commonly used modulation schemes for transmitting analog data over a bandpass channel (e.g., a microwave, cellular telephone, or other radio frequency link) include, for example, Amplitude Modulation (AM), Frequency Modulation (FM), Single Sidebanid Modulation (SSB), etc. Commonly used modulation schemes for transmitting digital data over a bandpass channel include, for example, Amplitude Shift Keying (ASK), Phase Shift Keying (PSK), and Frequency Shift Keying (FSK), etc. A carrier signal modified by the modulation process is known as a modulated carrier.

The second modulation category is called up-conversion and is used to refer to the process of shifting a signal from one frequency range to another (usually higher) frequency range. For example, in commercial broadcast applications, such as standard AM, FM, or television broadcasts, a radio program (the baseband signal) is used to modulate a radio frequency carrier signal. The modulated radio frequency carrier signal is amplified and provided to a transmitting antenna that radiates the amplified modulated radio frequency carrier signal as electromagnetic waves (radio waves). The electromagnetic waves may be received by a transistor radio and demodulated to recover the original radio program, which is then played on a loudspeaker. The baseband signal (the radio program) is an audio frequency signal, usually having frequencies in the range of 20–20,000 Hz. The radio frequency carrier is a radio frequency signal, often having a frequency of 50 MHz (megahertz) or higher.

The perceived differences between data modulation and up-conversion are largely illusory, and the distinction between data modulation and up-conversion is generally used merely for convenience. Thus, one skilled in the art will recognize that techniques used for data modulation can also be used for up-conversion, and vice versa. The term up-conversion is used herein as a convenient way to describe the process of using a modulator to shift the frequency of a signal from a lower frequency to a higher frequency.

When the data signal and the carrier signal are both analog signals, then a modulator may be constructed using an analog multiplier (also known as a mixer) having two inputs and one output. The data signal is provided to the first input and the carrier signal is provided to the second input. Given a passband signal $G(\omega)$, centered at $\omega_0$, and a carrier signal $\cos(\omega_c t)$, then the output $H(\omega)$ of the multiplier is a signal having two sidebands. The spectrum of the signal $H(\omega)$ is the combination of two terms known as upper and lower sidebands. The frequency components of the lower sideband correspond to the sum $\omega_c - \omega_0$ and the frequency components of the upper sideband correspond to the difference $\omega_c + \omega_0$. The multiplier is said to create sum and difference frequencies. The signal $H(\omega)$ may be filtered to remove one of the sidebands.

Alternatively, the data signal $g(t)$ may be represented by a digital signal $g(k)$. The signal $g(k)$ is a sequence of digital values, such as the output of an analog-to-digital converter, where k is an integer index which identifies the $k^{th}$ value in the sequence. When the data signal and the carrier signal are both digital signals, then a digital multiplier, having an output $h(k)$ may be used as a modulator. The output of the digital multiplier is a digital signal which may be converted to an analog signal by providing the signal $h(k)$ to an input of a digital-to-analog converter.

Manufacturers have sought to produce modulators that are more power efficient and lightweight. For example, a typical modulator used in a cellular telephone may comprise a digital-to-analog converter to provide the data signal, a first filter to remove unwanted sidebands produced by the digital-to-analog converter, a local oscillator to provide the carrier signal, a mixer to create the sum and difference products (sidebands) and a second filter to remove unwanted sidebands produced by the mixer.

The first filter is used to remove harmonics produced by the digital-to-analog converter because the analog signal produced at the output of the digital-to-analog converter comprises an infinite number of harmonics. Each harmonic corresponds to a harmonic frequency of the frequency at which digital values are provided to the analog-to-digital converter. The harmonics occur at frequencies given by $n\omega_s$, where $n = \pm 1 \ldots +\infty$ and $\omega_s$ is the sample frequency (i.e., the rate at which the digital-to-analog converter produces a new output value). Thus, a digital-to-analog converter, in addition to converting a digital signal to an analog signal, can act as an up-converter and convert a signal from baseband to a large number of harmonics.

Prior art attempts to minimize the number of components in the modulator generally result in increased distortion of the modulated signal. This increase in distortion adversely affects the modulation accuracy of the system, it adversely affects the power efficiency of the system, and it adversely affects the spectrum of the modulated signal.

The modulation accuracy of a system is usually specified in terms of the total allowable modulation error, expressed as an error budget. The error budget generally arises from industry specifications and government regulations. The error budget is "spent" by tallying the error (or distortion) introduced by each stage in the system. Errors produced by one stage of a system usually propagate through the system and may even increase the errors produced by later stages in the system. Thus, if one stage introduces a relatively large error, that large error must be offset by a relatively smaller error in other stages.

Distortions produced by the modulator often reduce power efficiency of the system because the distortions cause an increase in the amplitude of unwanted harmonics of the modulated signal. The power amplifiers, especially the transmitter power amplifiers, amplify these unwanted harmonics. In order to meet the total error budget of the system, the power amplifier is typically operated in a more linear region. Unfortunately, many RF power amplifiers are less efficient when operating in the linear region, and thus, linear operation may increase the drain on the batteries. Distortions, such as, for example, sinc distortion, in the modulator may also reduce the amplitude of desired harmonics of the modulated signal, resulting in a need for additional amplification, which also increases the power consumption of the power amplifiers, thereby diminishing battery life.

Finally, distortions produced by the modulator adversely affect the spectrum of the modulated signal in ways that often require additional filtering to correct (e.g., filters with steeper slopes and more filter stages). Additional filtering is often needed because the distortion may cause a relative increase in the amplitude of unwanted harmonics and a relative decrease in the amplitude of desired harmonics. The additional filtering is used to reduce the amplitude of unwanted harmonics and increase the amplitude of desired harmonics.

One type of distortion that is often found in a modulated signal is distortion due to a phenomenon known as the sinc effect (discussed below in connection with FIG. 3). The sinc effect causes a distortion of the modulated signal that adversely affects the error budget. When modulators of the type described above are incorporated into electronic devices, their relatively large inaccuracy uses up a large portion of the error budget, and attenuates the desired harmonics relative to the undesired harmonics.

SUMMARY

The present invention solves these and other problems by disclosing a digital-to-analog conversion and filtering technique that reduces the distortion and attenuation caused by the sinc effect. In one embodiment, the shape of the sinc function that gives rise to the sinc effect is altered in a manner such that the distortion produced by the sinc effect is reduced. In a preferred embodiment, the sinc function is altered such that a desired sideband is less effected. The digital-to-analog conversion and filtering technique can be used in a modulator that uses relatively fewer parts than conventional modulators and yet provides a modulated signal having low distortion. Reducing the distortion of the modulated signal helps to reduce overall power consumption of the system. In particular, reducing the distortion of the modulated signal allows the system designer to use power amplifiers that operate more efficiently. Reducing the distortion of the modulated signal may also allow the system designer to reduce the gain of the power amplifiers in some circumstances.

In one embodiment is a modulator comprising a digital-to-analog converter. An analog output of the converter provides a first output voltage corresponding to a digital input signal. The converter holds the output voltage desired time period $T_1$, after which, the output voltage returns to a second output voltage for a time period $T_2$. In a preferred embodiment, the output of the digital-to-analog converter is a return-to-zero (RTZ) output, wherein the second output voltage is substantially zero volts. Bringing the output back to a fixed voltage, such as zero volts, results in an output signal which can be described as a series of pulses. Configuring the output signal as a series of pulses pushes the nulls of the sinc function to higher frequencies so that the nulls are relatively farther from the desired sidebands than in a conventional analog-to-digital converter output signal. The distortion of a sideband is greater when the sideband is near a null in the sinc function. Attenuation of a sideband is also greater when the sidebands is near a null in the sinc function. Thus, the present invention reduces attenuation and distortion by moving the nulls of the sinc function away from the desired sidebands.

In yet another embodiment, a new digital value is provided to a digital input of the digital-to-analog converter every $T_s$ microseconds, and the sum of the time periods $T_1$ and $T_2$ corresponds to the sample period $T_s$, such that $T_s=T_1+T_2$.

BRIEF DESCRIPTION OF THE DRAWINGS

The various novel features of the invention are illustrated in the figures listed below and described in the detailed description that follows.

In the figures, the first digit of any three-digit number indicates the number of the figure in which the element first appears. Where four-digit reference numbers are used, the first two digits indicate the figure number.

DETAILED DESCRIPTION OF THE PREFERRED EMBODIMENT

The present invention involves the conversion of digital signals to analog signals in a manner that desirably provides up-conversion as well as conversion from the digital domain to the analog domain. Even though the processes of analog-to-digital conversion is well known, the invention will be more clearly understood in view of the following discussion of analog-to-digital conversion.

Figure 1:
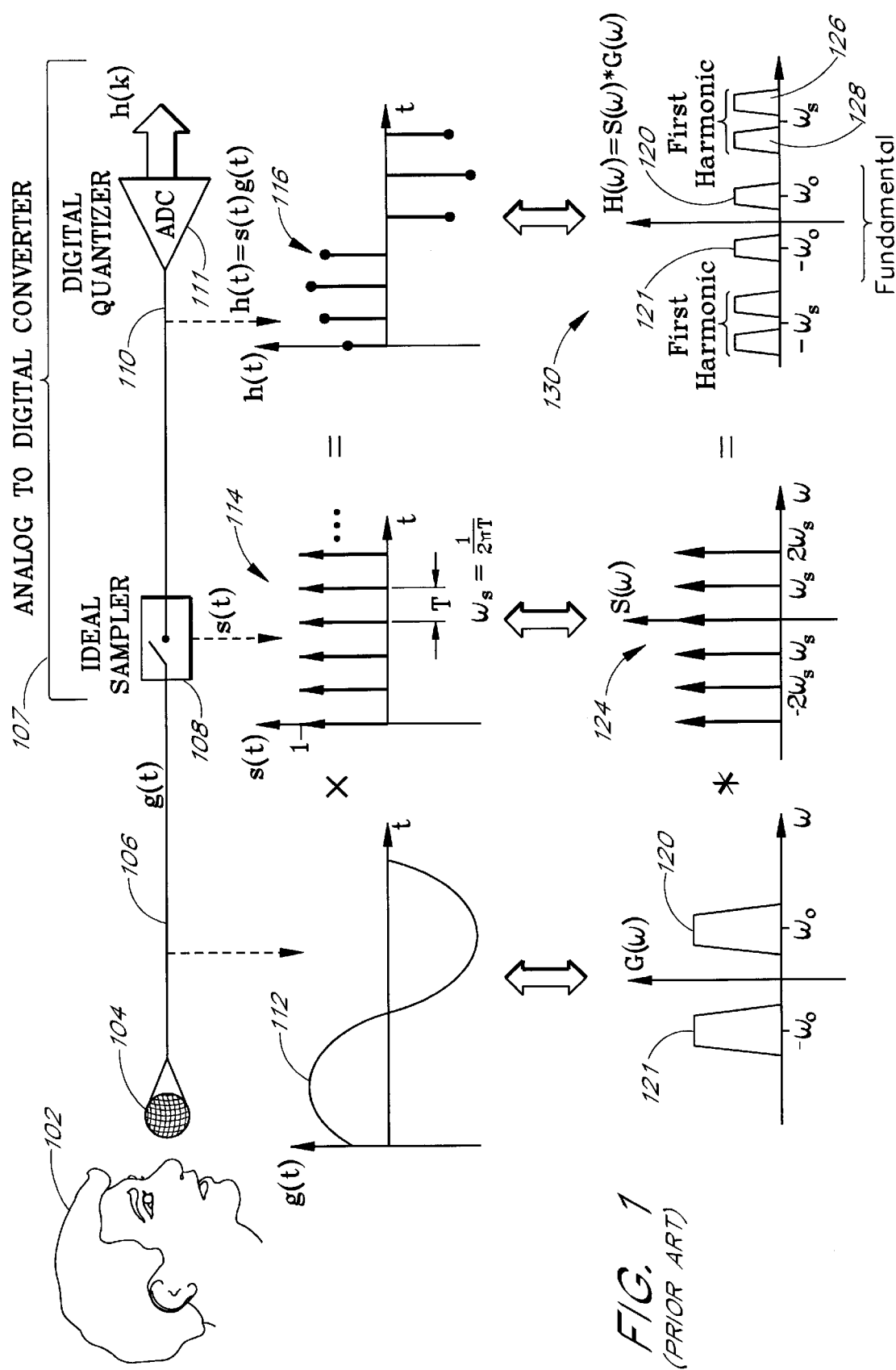
FIG. 1 is a block diagram of an analog-to-digital system, including time domain and frequency domain representations of the waveforms at various points in the system.

The process of analog-to-digital conversion is illustrated in FIG. 1, where an analog signal g(t) is created by a person 102 speaking into a microphone 104. The analog signal g(t) is provided on an analog signal line 106 to an ideal sampler 108. The ideal sampler 108 converts the continuous signal g(t) into a sampled signal h(t). The signal h(t) is a series of discrete samples with a time T between each sample. The signal h(t) is provided to an input of a digital quantizer 111. An output of the digital quantizer 111 is a sequence of digital values h(k). The ideal sampler 108 and the digital quantizer 111 comprise an analog-to-digital converter 107.

The analog signal g(t) is shown as a continuous smooth curve 112 having substantially continuous derivatives and finite energy. The signal g(t) may also be conveniently transformed using Fourier or Laplace transforms into a frequency domain signal G($\omega$). The transform pair g(t)↔G($\omega$) is shown in FIG. 1. Since the signal g(t) is produced by a microphone from a human voice, the signal G($\omega$) will have a band limited frequency spectrum comprising an upper frequency band 120 centered at a frequency co. and a lower frequency band 121 centered at a frequency $-\omega_0$ as shown in FIG. 1. One skilled in the art will recognize that the curve g(t) 112 is shown in FIG. 1 as a sine wave merely for convenience, and that in actuality a curve representing g(t) for a human voice would be more complex. Likewise, the sidebands 120 and 121 are greatly simplified and shown in FIG. 1 as idealized curves rather than representations of actual data.

As stated previously, the curve 112 representing g(t) is smooth and continuous, however, digital systems are typically designed to operate on data that has been sampled into discrete time intervals, and digital systems typically represent a continuous curve as a sequence of data values, one data value per time interval. Thus, before converting the signal g(t) from the analog domain to the digital domain, the signal g(t) is sampled by the ideal sampler 108. The ideal sampler 108 multiplies the signal g(t) by a sampling signal s(t). The signal s(t) comprises a series of delta functions separated by a time $T_s$, such that the sample frequency $\omega_s$ (e.g., the repetition rate of the pulses) is given by $\omega_s=2\pi/T$.

The signal s(t) is shown in FIG. 1 as a time domain plot 114. The Fourier transform of s(t) is S($\omega$) and is shown in FIG. 1 as a frequency domain plot 124. The plot 124 shows that S($\omega$) is simply a sequence of delta functions a $n\omega_s$ where n=+0, ±1, ±2, . . . , ±∞.

The process of analog-to-digital conversion is a process of real-world to mathematical-world conversion. In other words, a digital signal produced by an analog-to-digital converter is a mathematical representation of the analog signal. The ideal sampler 108 is a convenient way to mathematically describe the process of quantizing a smooth and continuous signal g(t) into a discrete sequence of samples, as represented by the signal h(t) produced at the output of the ideal sampler 108. The digital quantizer 111 converts the idealized signal h(t) into digital values, as represented by a signal h(k), where k=0, ±1, ±2, . . . , ±∞. The frequency domain representations of h(t) and h(k) are similar.

The ideal sampler 108 multiplies g(t) by s(t), thus h(t)= g(t)s(t) as shown in a plot 116 in FIG. 1, is a sequence of pulses spaced at intervals of T where the height of the pulses tracks the curve 112. It is well known that multiplication in the time domain is equivalent to convolution (represented as a * symbol) in the frequency domain. Thus, H($\omega$)=G($\omega$)*S($\omega$) comprises repeating copies (harmonics) of the fundamental sidebands 120 and 121, as shown in a plot 130. The copies repeat every $n\omega_s$ resulting in an infinite number of harmonics. The plot 130 shows the original sidebands 120 and 121, and the first harmonics 126 and 128. The harmonic 126 is centered at $\omega_2+\omega_0$ and the harmonic 128 is centered at $\omega_s-\omega_0$. Also shown in the plot 130 are the negative frequency images of the harmonics 126 and 128 centered at $-(\omega_s+\omega_0)$ and $-(\omega_s-\omega_0)$. All of the harmonics are substantially identical copies of the fundamental sidebands 120 and 121 in all respects, including height, bandwidth, and shape, except that the harmonics are shifted in frequency.

Having produced a signal h(k) representing an analog-to-digital conversion of the signal g(t) it is instructive to examine the process of digital-to-analog conversion using prior art methods used to construct an analog signal from the signal h(k). If the process of analog-to-digital conversion is perfect, and the subsequent process of digital-to-analog conversion is perfect, then the reconstructed analog signal g*(t) will be identical to the original signal g(t). As will be seen, the processes are not perfect, and thus g*(t) is only approximately equal to g(t).

Figure 2:
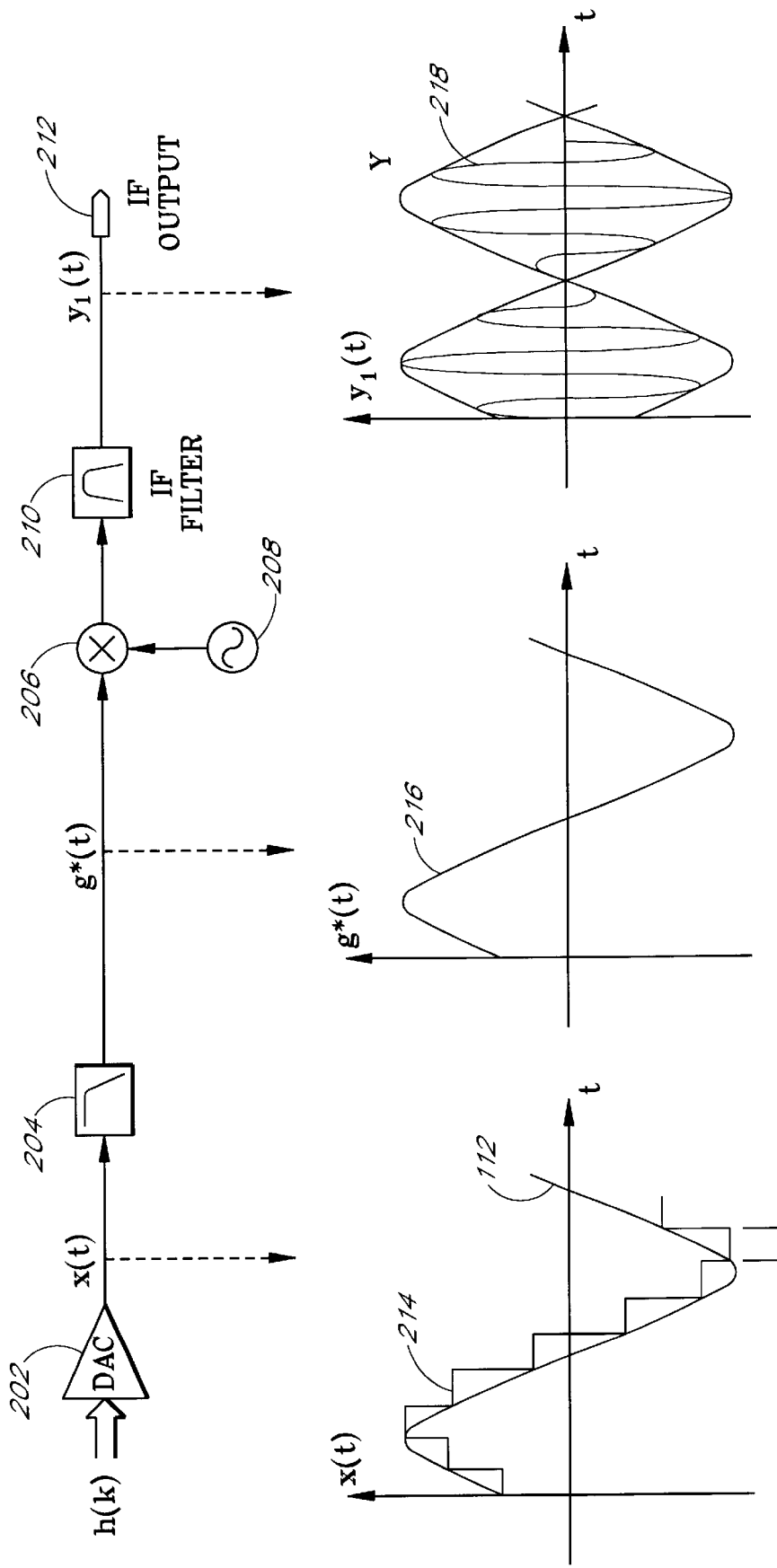
FIG. 2 is a block diagram of a digital-to-analog system, including time-domain representation of the waveforms at various points in the system.

The process of digital-to-analog conversion is illustrated in FIG. 2, where the signal h(k) is provided to a digital input of a digital-to-analog converter 202. An output of the digital-to-analog converter 202 is a signal x(t), which is provided to an input of a bandpass (or lowpass) filter 204. The signal g*(t) is provided as an output of the filter 204.

FIG. 2 also shows the process of using a mixer to up-convert the analog signal g*(t) to produce an Intermediate Frequency (IF) signal $y_1(t)$. The signal g*(t) is provided to a first input of a mixer 206 and an output of a Local Oscillator (LO) 208 is provided to a second input of the mixer 206. An output of the mixer 206 is provided to an input of an IF bandpass filter 210. The signal $y_1(t)$ is an output of the filter 210.

As shown from the plot 130 in FIG. 1, the frequency spectrum of the incoming digital signal h(k) comprises a series of repeating harmonics which are symmetric about the origin. The repeating harmonics repeat to infinity in each direction. The bandwidth of the fundamental signal G($\omega$) is desirably less than $\omega_s/2$, and the repeating harmonics are centered about integer multiples of positive and negative frequencies $\pm\omega_s$. The frequency spectrum of H($\omega$) is given by:

$$H(\omega) = \sum_{n=-\infty}^{+\infty} G(\omega - n\omega_s) \qquad (1)$$

Referring now to FIG. 2, the output of the digital-to-analog converter 202 uses a process known as zero-order interpolation to produce a staircase waveform corresponding to the digital signal. Zero-order interpolation is commonly referred to as sample-and-hold processing. The output of the digital-to-analog converter 202 is a continuous signal having a beginning value corresponding to the value of the first digital sample (e.g., h(0)) provided to the input of the digital-to-analog converter 202. The digital-to-analog converter 202 holds this value for one complete period T. then rapidly changes the value of the staircase waveform to the next value of the digital signal for the next period T (corresponding to h(1)). This process continues with each respective pulse in the signal to produce a staircase signal x(t) shown in FIG. 2 as a curve 214. The staircase signal x(t) comprises the desired signal g*(t) plus higher order harmonics. The higher order harmonics are desirably removed by the filter 204, leaving the desired signal g*(t).

Figure 3:
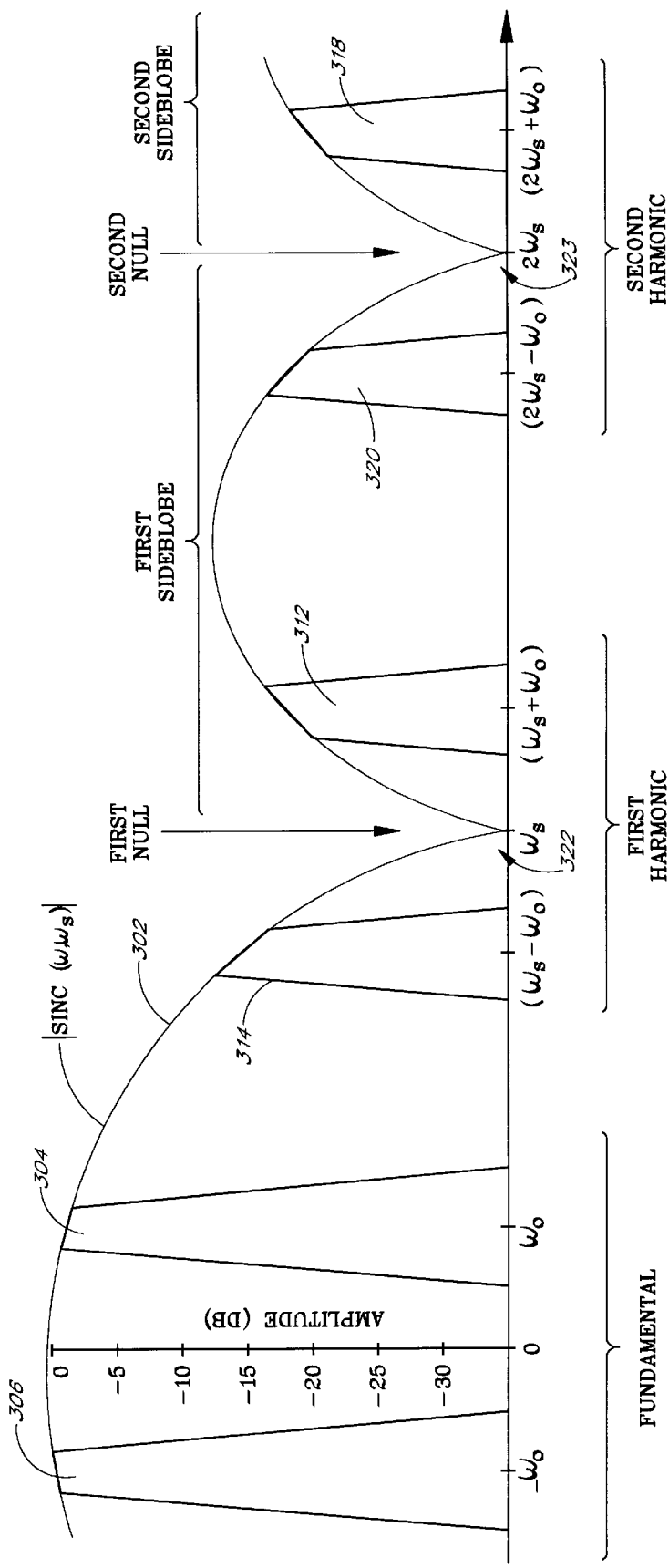
FIG. 3 is a frequency domain representation of the analog signal produced by an analog-to-digital converter shown in FIG. 2.

FIG. 3 shows a frequency domain plot of $|X(\omega)|$ (the Fourier transform of x(t)). The signal $X(\omega)$, like the signal $H(\omega)$, can be described as a fundamental and an infinite set of similar sidebands. However, unlike the signal $H(\omega)$, the sidebands in $X(\omega)$ are not substantially identical to the fundamental. In fact, the sidebands in $H(\omega)$ are modulated by a sinc function shown as a curve 302 in FIG. 3. The sinc function arises because the output of the digital-to-analog converter 202 is a sample-and-hold output. The sample-and-hold character of the output is evident in the staircase curve 214 shown in FIG. 2, wherein each analog output value is held until a new analog value is provided.

The shape of the sinc function producing the curve 302 (ignoring a constant amplitude factor) is given by the formula $sinc(\omega)=sin(\pi\omega/\omega_S)/(\pi\omega/\omega_S)$. The curve 302 has a peak of unity (0 dB) with a slope of zero at $\omega=0$, and it has a first null 322 at $\omega=\omega_S$, a second null 323 at $\omega=2\omega_S$, and an $n^{th}$ null at $\omega=n\omega_S$ (not shown). The curve 302 shows a first sidelobe in the frequency band $\omega_S<\omega<2\omega_S$ and a second sidelobe in the frequency band $2\omega_S<\omega<3\omega_S$. As shown in FIG. 3, the signal $X(\omega)$ has a fundamental comprising an upper sideband 304 centered at $\omega_0$ and a lower sideband 306 centered at $-\omega_0$. The sidebands 304 and 306 are distorted slightly by the sinc curve 304, but since the curve 304 is unity with a slope of zero at the origin, the effect on the sidebands 304 and 306 is small. The sidebands 304 and 306 are reduced slightly in amplitude, and the higher frequencies are attenuated slightly more than the lower frequencies (e.g., the top of the sideband 304 is not flat).

Like the signal $H(\omega)$, the signal $X(\omega)$ also has an infinite number of harmonics. However, unlike the signal $H(\omega)$, the sidebands of the signal $X(\omega)$ are distorted by the sinc curve 302. FIG. 3 shows a first harmonic comprising a sideband 312 centered at $\omega=\omega_S\omega_0$ and a sideband 314 centered at $\omega=\omega_S-\omega_0$ (where $\omega_0<\omega_S/2$). Since the sidebands 312 and 314 are close to the null 322, the sidebands 312 and 314 are considerably distorted. The sideband 312 is attenuated approximately 17 dB on average, and lower frequencies of the sideband 312 are attenuated almost 5 dB more than the higher frequencies. The sideband 314 is attenuated approximately 15 dB on average, and the high frequencies are attenuated almost 5 dB more than the low frequencies. The sideband 312 is attenuated more than the sidelobe 314 because the sideband 312 is under the first sidelobe of the curve 302 and the peak of the first sidelobe occurs at approximately −13 dB. By contrast, the sideband 314 is attenuated less than the sideband 312 because the sideband 314 is under the main lobe of the curve 302 and the main lobe peaks at 0 dB.

The sinc function shown in FIG. 3 arises because of the sample-and-hold process. In mathematical terms, this sample-and-hold process corresponds to a convolution of each incoming digital pulse with a rectangular waveform having a height equal to 1 and a width equal to T. In other words, the rectangular waveform, given by a function p(t), equals 1 between the interval of 0 to T, and equals 0 at all other locations. The formula for the resulting sample-and-hold waveform in the time domain is given by:

$$x(t) = \sum_{n=-\infty}^{+\infty} h(n)\delta(t-nT) * p(t) \quad (2)$$

where the function h(n) provides the values of the incoming digital signal and $\delta$ is the delta function.

FIG. 3 shows the frequency spectrum of the incoming digital signal, as shown in FIG. 2, together with the frequency spectrum, $P(\omega)$, of the rectangular waveform. The well-known formula for $P(\omega)$ is given as follows:

$$|P(\omega)| = \left|\frac{T\sin(\pi\omega/\omega_s)}{\pi\omega/\omega_s}\right| \quad (3)$$

The signal $P(\omega)$ is a sinc function comprising a sinusoidal function with a large amplitude about the origin, and which decays in both the positive and negative directions.

The combined signal resulting from the multiplication of the frequency spectrum of the incoming digital signal and the frequency spectrum of the sample-and-hold pulse, P((s), is therefore given by:

$$X(\omega) = \left[\sum_{n=-\infty}^{+\infty} H(\omega - n\omega_s)\right] P(\omega) \quad (4)$$

The sinusoidally decaying frequency spectrum of the rectangular waveform causes the combined signal to have a distortion commonly known as the "sinc" effect. The sinc effect causes the amplitudes of the frequencies between positive and negative $\omega_S$ to be larger, by comparison, than the amplitudes of the frequencies greater than $|\omega_S|$. Thus, zero-order interpolation functions essentially like a low-pass filter.

Moreover, the distortion caused by the sinc effect is especially significant in the proximity of nulls (points where the sinc function equals zero). The slope of the curve corresponding to the combined signal becomes much steeper as the values approach zero in these regions and consequently produces more attenuation on the side of a given harmonic which is closest to a null. Such asymmetrical attenuation causes substantial error in the modulated signal.

In prior art modulators, the signal x(t) is passed through a lowpass filter to remove the undesirable frequency harmonics in the signal. In many applications, the analog signal must also be multiplied up to a higher frequency for subsequent use. In such configurations, the frequency multiplier 206 shown in FIG. 2 is used to create higher frequency components (desired and undesired) and the IF bandpass filter 210 is used to remove the undesirable frequencies added by the multiplier. The output of the bandpass filter 210 is a modulated signal yl(t) shown as a curve 218 in FIG. 2. The curve 218 oscillates at a frequency substantially corresponding to the frequency of the local oscillator 208, and the curve 218 has an envelope corresponding to the signal g*(t).

Figure 4:
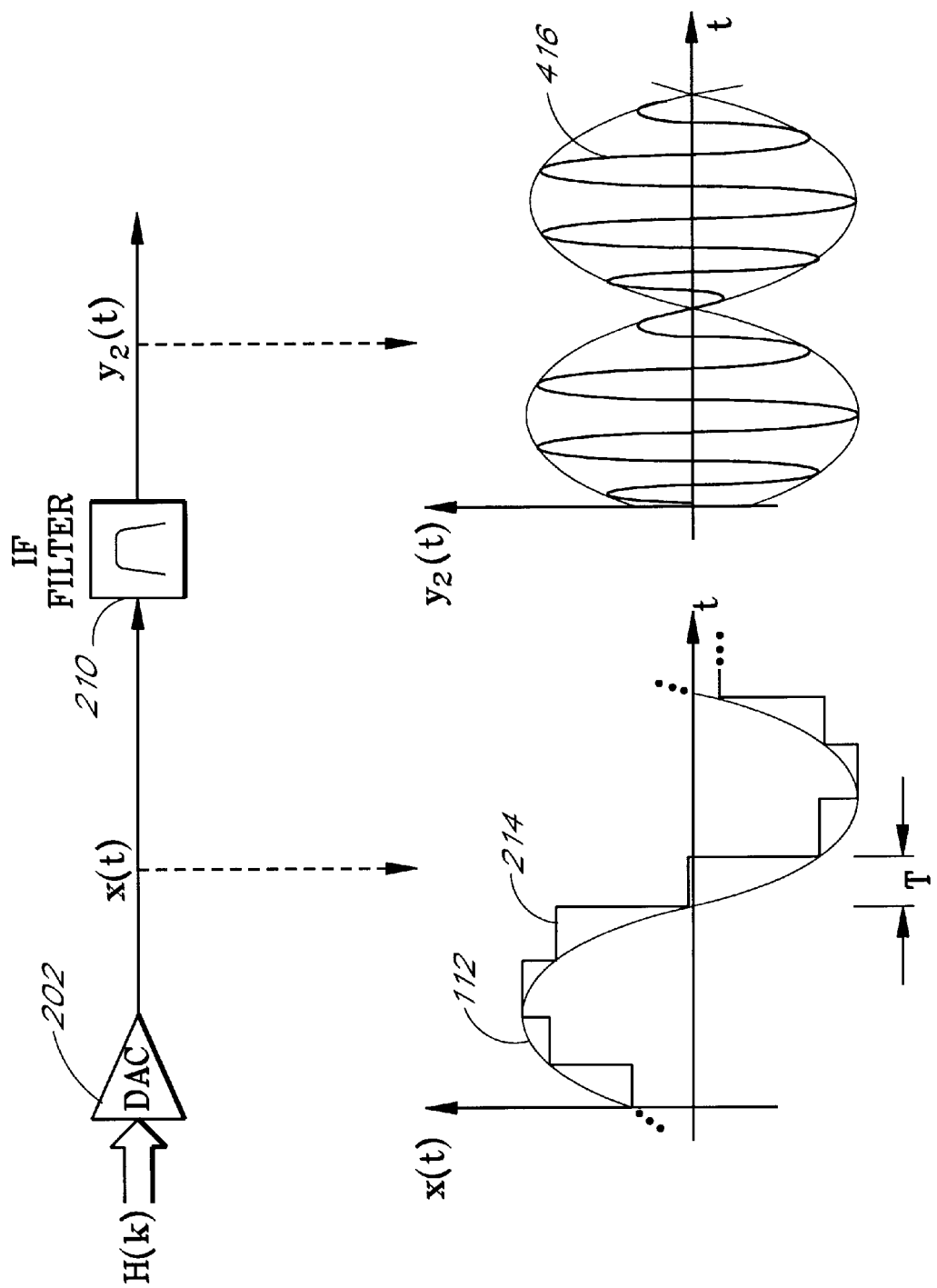
FIG. 4 is a block diagram of a digital-to-analog up-converter system, including time domain representations of the waveforms in the system.

The number of required components may be reduced by removing, the bandpass filter 204, the local oscillator 208 and the mixer 206,l leaving the digital-to-analog converter 202 and the IF bandpass filter 210, as shown in FIG. 4. The output of the digital-to-analog converter 202 is provided to the input of the IF bandpass filter 210 and the output of the bandpass filter 210 is an IF signal $y_2(t)$. The signal $y_2(t)$ is shown as a curve 416 in FIG. 4. As explained in more detail below, the curve 416 oscillates at a frequency substantially corresponding to a harmonic of the sample frequency $\omega_S$, and the curve 416 has an envelope corresponding to the signal g*(t).

Figure 5:
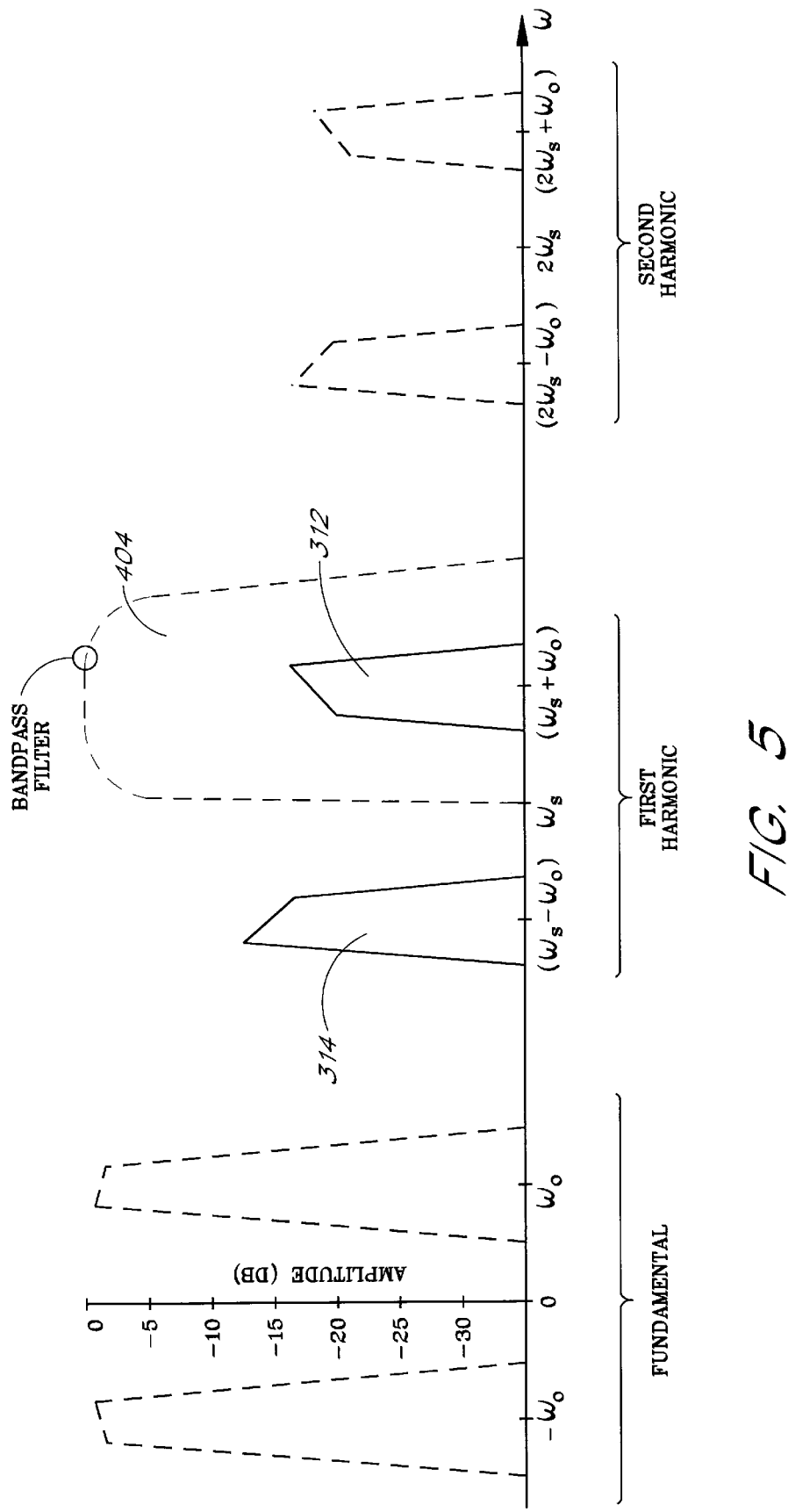
FIG. 5 is a frequency domain representation of the waveforms in the system shown in FIG. 4.

The frequency domain waveform $Y_2(\omega)$ is shown in FIG. 5. FIG. 5 shows essentially the same spectrum as FIG. 3, and FIG. 5 also shows the spectrum of the bandpass filter 210 as a curve 404. The curve 404 (showing the passband of the bandpass filter 210) passes only the sideband 312. The sideband 312 is related to the first harmonic frequency $\omega_S$. The output of the bandpass filter 210 has the spectrum of a single-sideband amplitude modulated signal with a carrier frequency of $\omega_S+\omega_0$. This is the same type of signal that is produced by the up-converter (the combination of the local oscillator 208, the mixer 206, and the bandpass filter 210) shown in FIG. 2. Thus, the combination of a digital-to-analog converter and a bandpass filter provides conversion from digital to analog and up-conversion.

A number of inherent deficiencies result from using a harmonic (e.g., one or both of the sidebands 312 and 314) from a sample-and-hold output rather than using the fundamental frequency bands and an up-converter. The sidebands of the first harmonic are distorted due to the sine effect because the sidebands lie close to the null 322, causing them to have particularly poor asymmetrical attenuation. As discussed above, this increase in distortion adversely affects the spectrum of the modulated signal, it adversely affects the modulation accuracy of the system, and it adversely affects the power efficiency of the system. In particular, the distortion may cause a relative increase in the amplitude of unwanted harmonics sidebands and a relative decrease in the amplitude (power) of one or more desired harmonic sidebands in the modulated signal.

The diminished power of a desired harmonic sideband, and the accompanying requirement of increased amplification, are clearly shown in FIG. 5. Due to the sinc effect, the amplitude of the desired sideband 312 is approximately 17 dB less than that of the amplitude of the fundamental. Moreover, the desired sideband 312 itself is distorted, with the lower frequencies of the sideband 312 being attenuated approximately 5 dB more than the upper frequencies of the sideband 312 (as shown by the slope in the top of the sideband 312).

Figure 6:
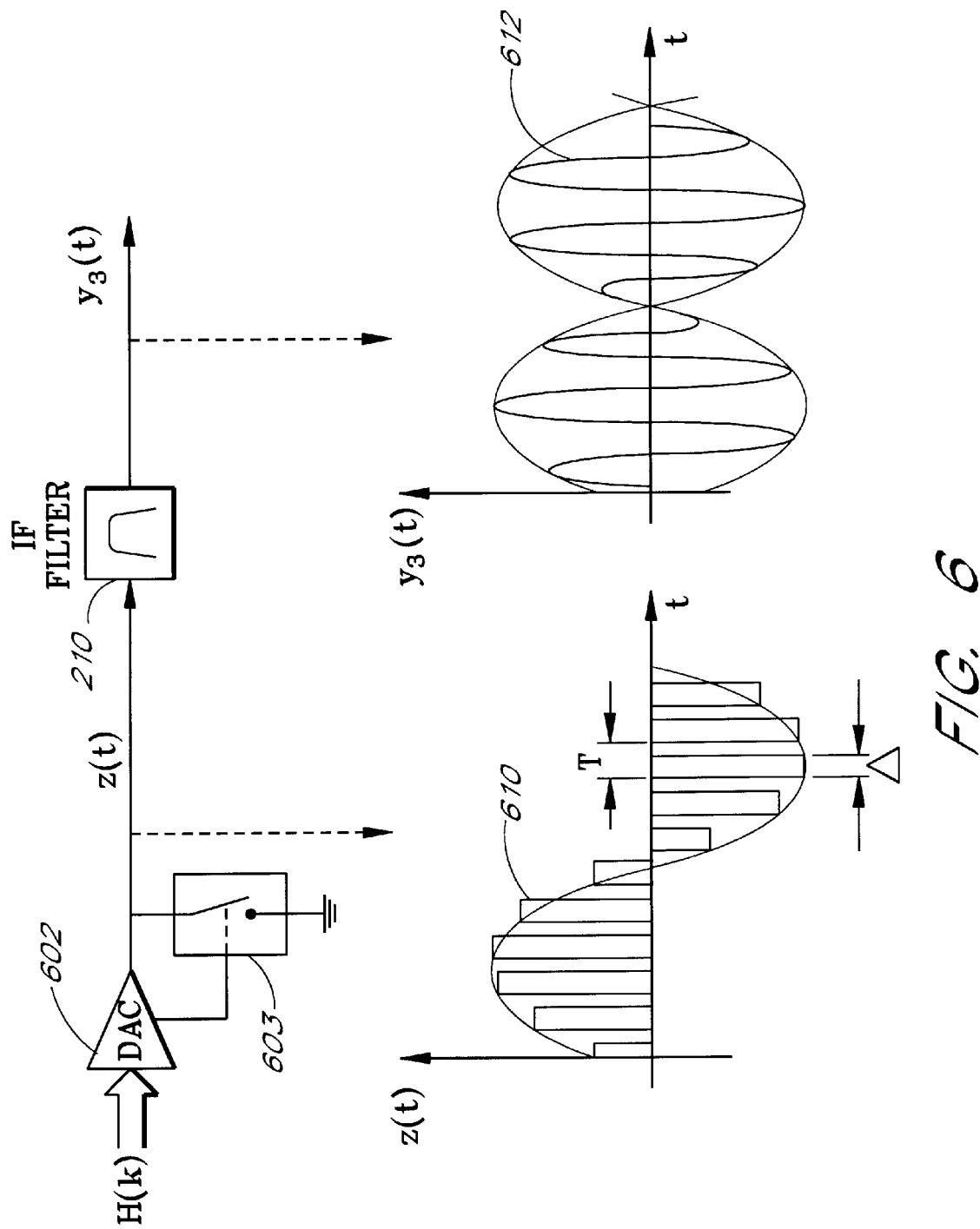
FIG. 6 is a block diagram of a digital-to-analog up-converter system in accordance with one aspect of the present invention.

FIG. 6 shows a combined digital-to-analog converter and frequency multiplier that reduces the distortion and error caused by the sine function. In FIG. 6, the sequence of digital values h(k) is provided to a digital input of a digital-to-analog converter 602 and an analog output z(t) of the digital to analog converter 602 is provided to a first input of a switch 603 and to an input of the bandpass filter 210. A second input of the switch 603 is provided to ground. A control output of the digital-to-analog converter is provided to a control input of the switch 603.

The switch 603 returns the analog output of the digital-to-analog converter to ground during a portion of each sample period, so that the output signal z(t) is not a stairstep (as was the signal x(t)) but rather is a series of pulses. The pulses occur at the sample rate (pulse repetition frequency) $\omega_S$ and have a pulse width $\Delta$, as shown in a curve 610 in FIG. 6.

One skilled in the art will recognize that the use of the switch 603 is only one of many ways that an analog output from a digital-to-analog converter can be provided as a series of pulses. The block diagram shown in FIG. 6 is intended to be used for purposes of illustration, and not as a limitation. Other methods for producing a series of pulses having a pulse width $\Delta$ and a pulse repetition frequency (PRF) $\omega_S$ are within the scope of the present invention.

Mathematically, the incoming digital signal $h(k)\delta(t-kT)$ is convolved with a rectangular pulse, $p_n(t)$, which equals 1 for the period between 0 and $\Delta$ (a number which is smaller than T), and equals 0 at all other locations. Thus:

$$x(t) = \sum_{n=-\infty}^{+\infty} h(n)\delta(t-nT)^* p_n(t) \qquad (5)$$

The ratio of $\Delta/T$ is known as the "duty cycle" of $p_n(t)$, and indicates the percentage of a period during which $p_n(t)$ has an identity value. Ignoring a constant scaling factor, the frequency spectrum of $p_n(t)$, known as $P_n(o)$), is given by:

$$|P_n(\omega)| = \left|\frac{\sin(\pi\omega_\Delta)}{\pi\omega_\Delta}\right| \qquad (6)$$

where $\omega_\Delta=2\pi/\Delta$. The variable $\Delta$ is chosen to generate a desired duty cycle for a given application, which depends on the frequency harmonic to be obtained from the digital-to-analog converter. As $\Delta$ becomes smaller and smaller, the graph of $P_n(\omega)$ has an increasingly smaller slope, and the respective distances between nulls increases. If, for example, $\Delta=T/2$ (that is, the pulse returns to zero after half of a period) then, $P_n(\omega)$ is given by:

$$|P_n(\omega)| = \left|\frac{T}{2}\frac{\sin\left(\frac{\pi\omega}{2\omega_s}\right)}{\frac{\pi\omega}{2\omega_s}}\right| \qquad (7)$$

Figure 7:
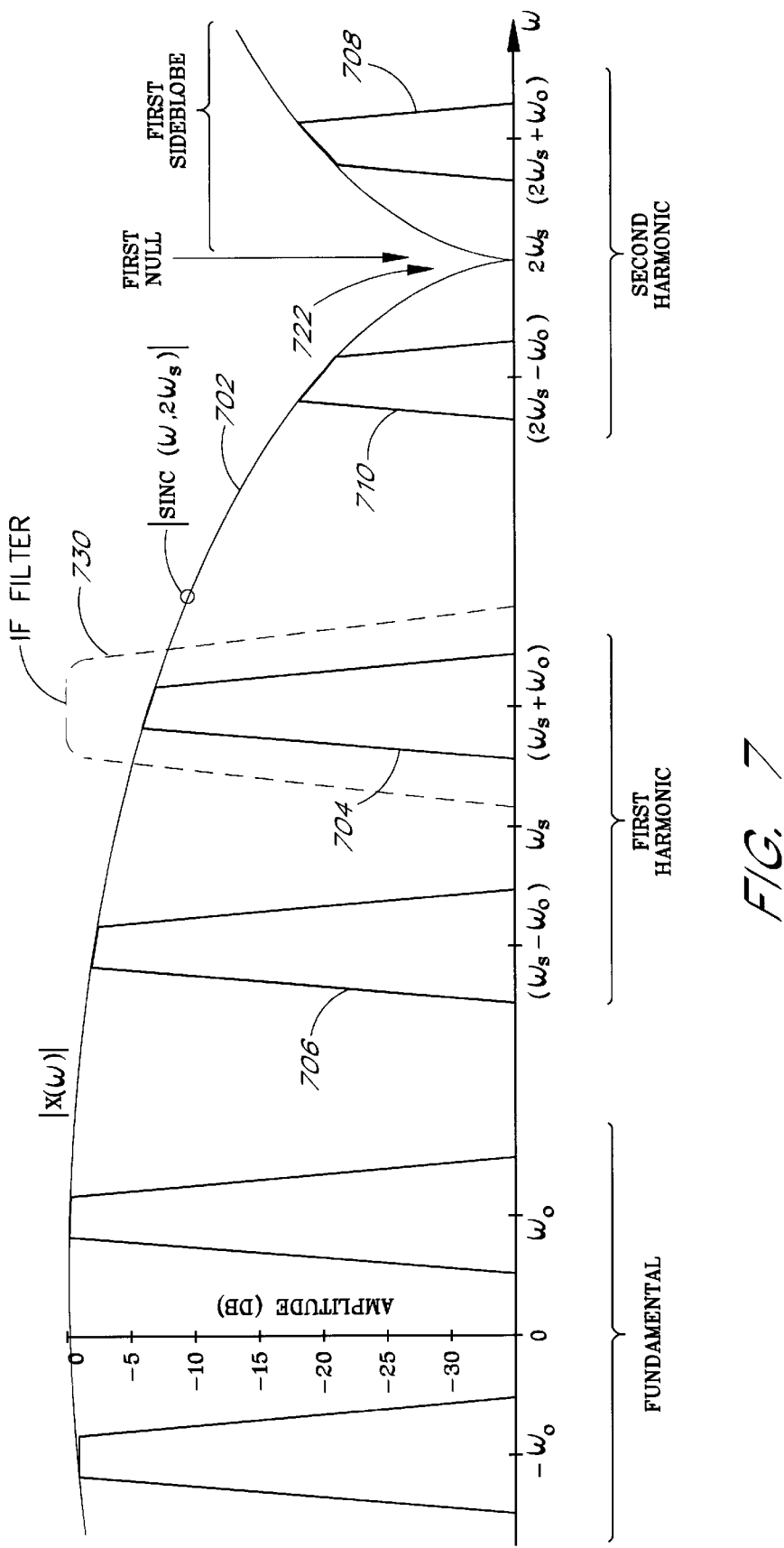
FIG. 7 is a frequency domain representation of the waveforms in the system shown in FIG. 6.

FIG. 7 shows a curve 702 corresponding to the spectra of the sinc function (produced by the pulse $p_n(t)$ for $\Delta=T/2$) and the spectrum of the signal $Z(\omega)$. The curve 722 has a first null 722 at $2\omega_S$ (rather than a first null at $\omega_S$ as shown in FIG. 3). The signal $Z(\omega)$ includes a fundamental having sidebands centered at $\omega_S$ and $-\omega_S$. The signal $Z(\omega)$ also includes a first harmonic having a sideband 704 centered at $\omega_S-\omega_0$ and a sideband 706 centered at $\omega_S-\omega_0$. The signal $Z(\omega)$ further includes a second harmonic having a sideband 708 centered at $2\omega_S+\omega_0$ and a sideband 710 centered at $2\omega_S-\omega_0$. A curve 730 shows the transfer function of the bandpass filter 210.

Thus, the sidebands 704 and 706, corresponding to the first harmonic, are well removed from the first null 722. This means that the sidebands 704 and 706 are not as strongly attenuated or distorted as the sidebands 312 and 314 shown in FIG. 3. In fact, the sidebands 704 and 706 are only about 5 dB down from the fundamental, and the difference between the attenuation of the highest and lowest frequencies of each sideband is only about 1 dB.

Comparison of FIG. 7 and FIG. 3 shows the following: (i) the amplitude of $P_n((o)$ decreases more gradually than $P(\omega)$ with increasing values of c; (ii) the null points of $P_n(c)$ occur at higher frequencies than the null points of $P(\omega)$; and (iii) the sidebands of the desired signal can be moved further away from the null points of $P_n(O)$ than the null points of $P(\omega)$.

Since the amplitude of $P_n(\omega)$ decrease more gradually, the amplitude of the combined signal comprising $P_n(\omega)$ and the incoming digital signal h(k) also decreases more gradually, and thus there is a more gradual drop-off in power between the fundamental frequency and the harmonic frequencies.

The additional distance between null points provides another advantage. Since the null points occur further from the origin, there are more harmonics within the envelope between the origin and the first null point. These harmonics are much easier to use because the power does not dramatically decrease until the first null point.

Moving the desired sidebands away from the null points provides yet another advantage. Since the slope of a sinc function is smaller away from the null points, the individual harmonic frequency signals have less asymmetrical attenuation and therefore have less distortion and the overall signal has a smaller modulation vector error. Moreover, the requirements (e.g. rolloff rate) placed on the bandpass filter that selects the desired sideband are relaxed, and, therefore, cost and complexity are reduced.

Figure 8:
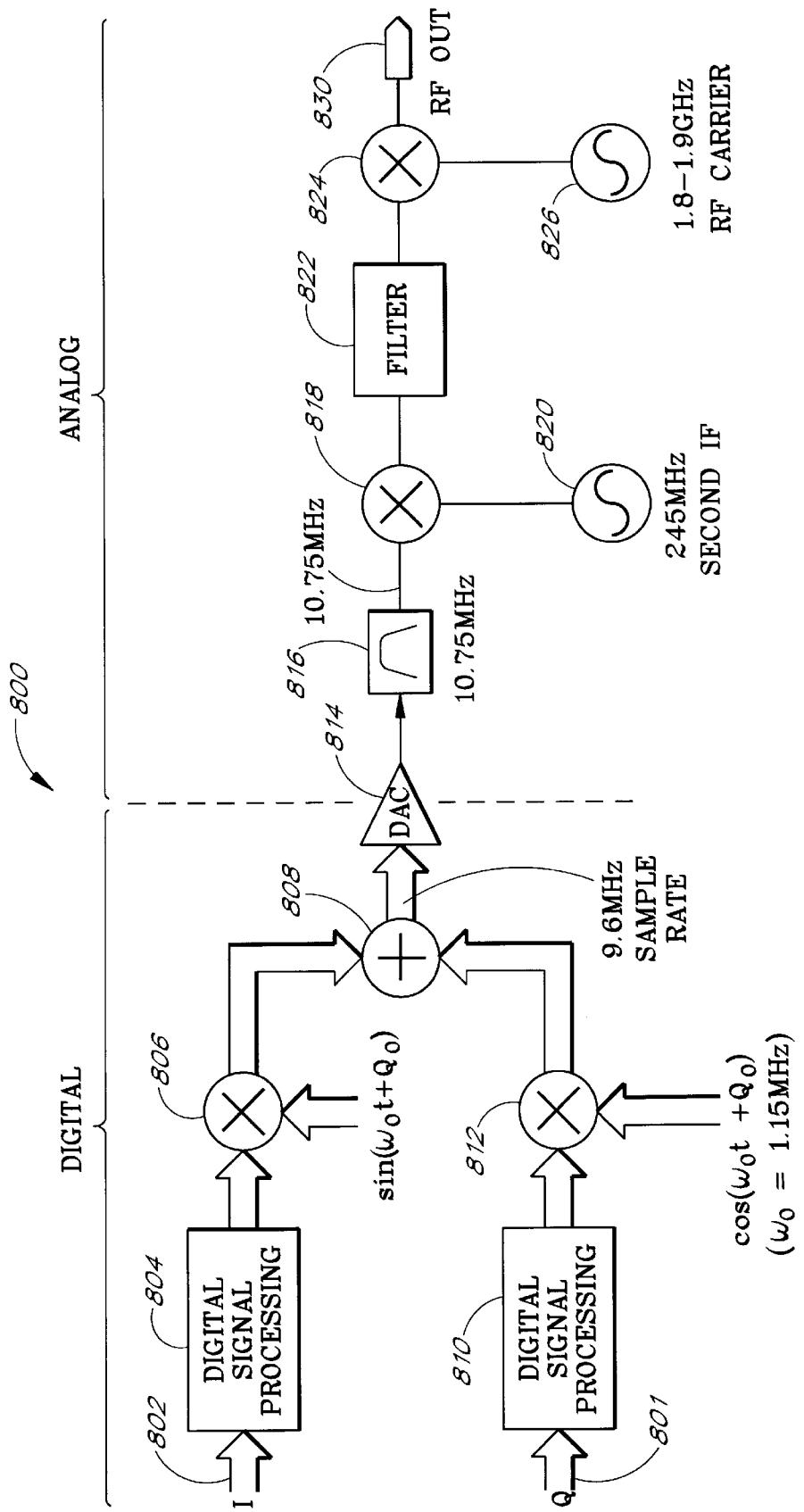
FIG. 8 is a block diagram of a transmission system comprising a balanced modulator.

FIG. 8 shows one embodiment of a transmitter 800 that uses digital-to-analog conversion and frequency up-conversion. The transmitter 800 is one embodiment of a transmitter for a microcellular telephone application. The transmitter 800 has an I-channel input 802, which is provided to an input of a digital signal-processing block 804. An output of the block 804 is provided to a first input of a digital multiplier 806 and an output of a digital sine sequence generator is provided to a second input of the multiplier 806. An output of the multiplier 806 is provided to a first input of a digital adder 808. The transmitter 800 has a Q-channel input 801, which is provided to an input of a digital signal-processing block 810. An output of the block 810 is provided to a first input of a digital multiplier 812 and an output of a digital cos sequence generator is provided to a second input of the multiplier 812. An output of the multiplier 812 is provided to a second input of the digital adder 808.

An output of the digital adder 808 is provided to a digital input of a digital-to-analog converter 814. An analog output of the digital to analog converter 814 is provided to a bandpass filter 816 having a center frequency of 10.75 MHz, corresponding to a first IF frequency. An output of the filter 816 is provided to a first input of a mixer 818 and an output of a 245 MHz local oscillator 820 is provided to a second input of the mixer 818. An output of the mixer 818 is provided to a bandpass filter 822 having a center frequency of 255.75 MHz. An output of the filter 822 is provided to a first input of a Radio Frequency (RF) mixer 824 and an output of a 1.8–1.9 GHz RF carrier oscillator 826 is provided to a second input of the mixer 824. An output of the mixer 824 is an RF OUT signal 830 which may be provided to RF power amplifiers (not shown) and/or an antenna (not shown).

The signal processing block 804 and 810, the digital multipliers 806 and 812, and the digital adder 808 comprise a balanced modulator to provide digital data modulation of the digital baseband signal (e.g., a voice signal in a cellular telephone). The modulated digital signal is converted to an analog signal by the digital-to-analog converter 814. The analog signal provided by the digital-to-analog converter 814 may be a non-return-to-zero signal, as discussed in connection with FIGS. 9a and 9b. Alternatively, the analog signal provided by the digital-to-analog converter 814 may be a return-to-zero signal, as discussed in connection with FIGS. 10a and 10b. The analog signal is up-converted to a first IF by the digital-to-analog converter 814 and the filter 816. The subsequent mixer and filter stages up-convert the signal to the second IF and then to RF.

Figure 9A:
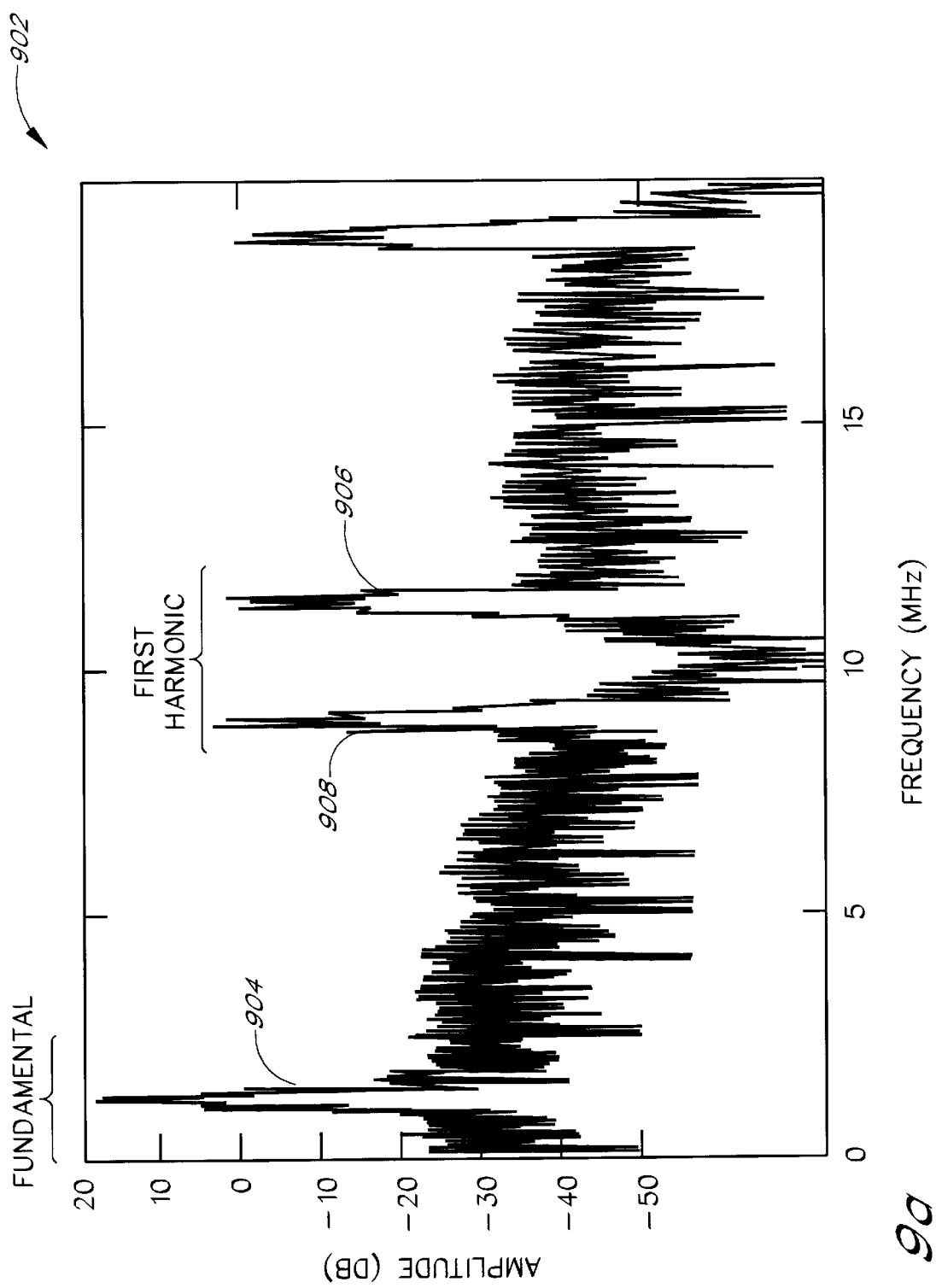
FIG. 9a is a frequency domain representation of an output of the balanced modulator as shown in FIG. 8.

FIG. 9a is a frequency domain representation of an output of the balanced modulator as shown in FIG. 8. FIG. 9a corresponds to a modulator wherein the digital-to-analog converter 814 has a sample-and-hold output. FIG. 9a shows a fundamental 904 and first harmonic sidebands 908 and 906. The sinc function is clearly visible in the noise (between the sidebands) and the first null can be seen between the sidebands 906 and 908. The sidebands 908 and 906 are approximately 15 dB below the fundamental 904.

Figure 9B:
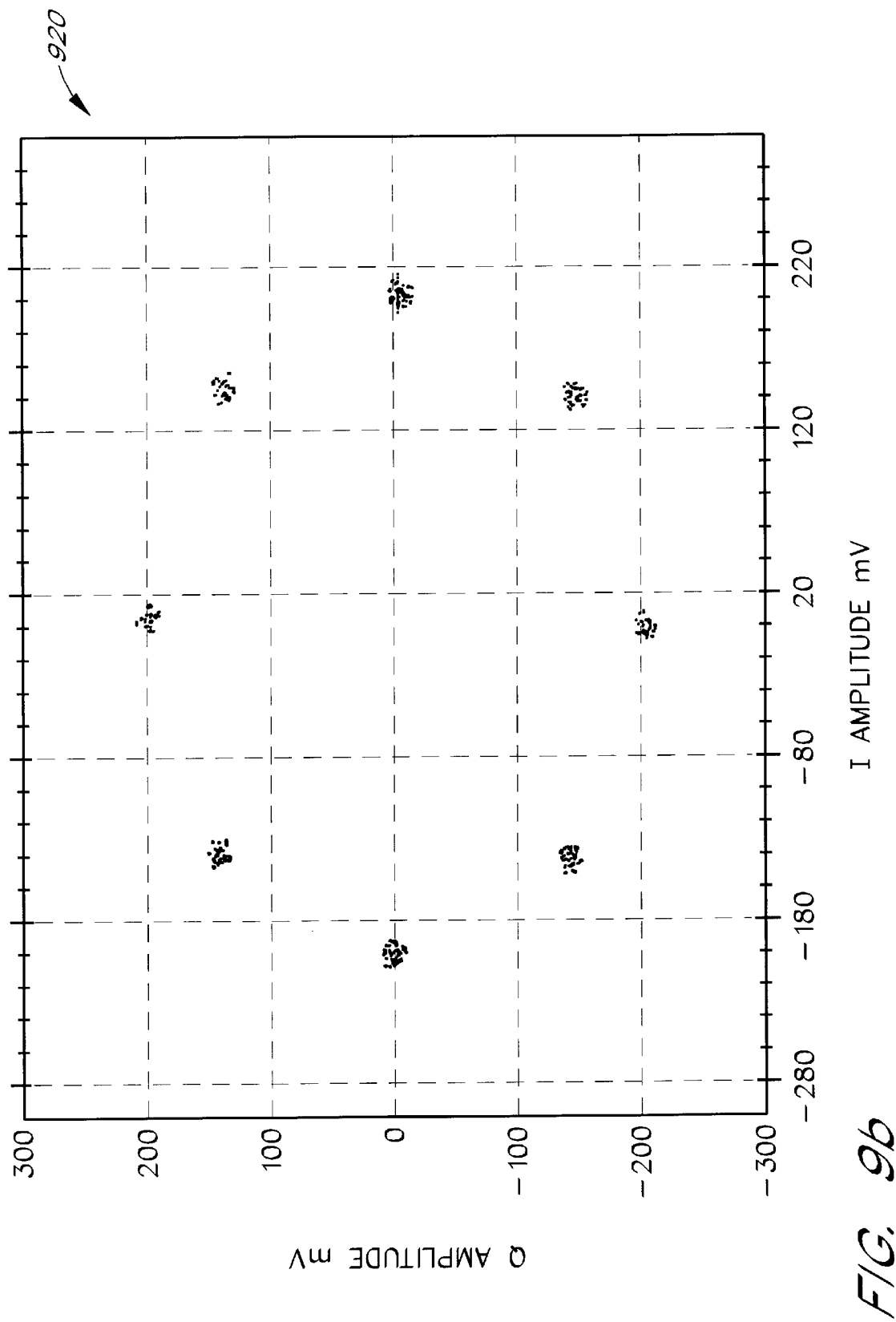
FIG. 9b is an I/Q constellation diagram of the modulated signal produced by an output of the balanced modulator as shown in FIG. 8.

FIG. 9b is an I/Q constellation diagram of the modulated signal produced by an output of the balanced modulator corresponding to FIG. 9a. The constellation in FIG. 9b shows eight data states and an error (scatter) of approximately 5%. The error is due, primarily, to errors in modulation due to the distortions caused by the sinc effect.

Figure 10A:
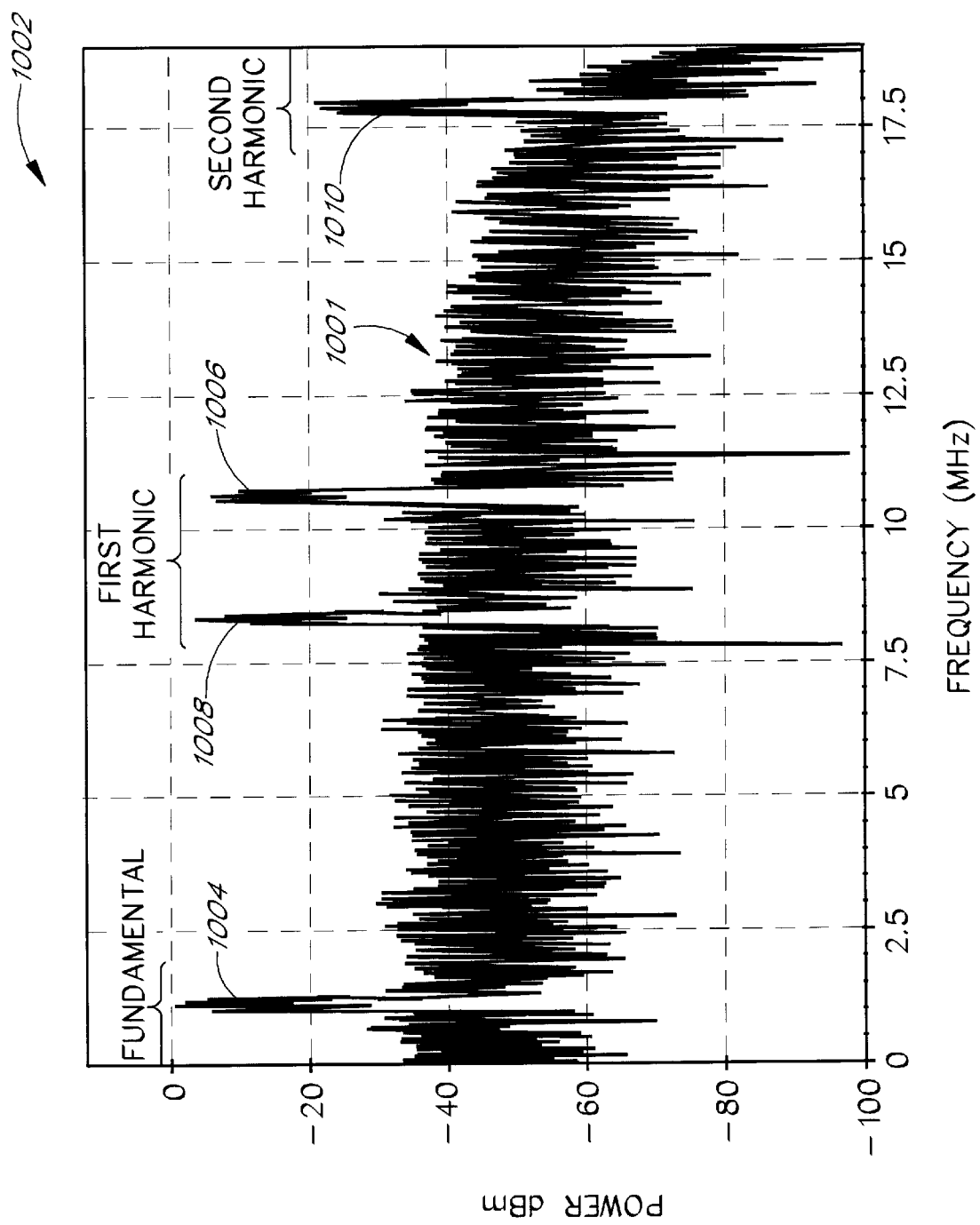
FIG. 10a is a frequency domain representation of an output of the balanced modulator as shown in FIG. 8.

FIG. 10a is frequency domain representation of an output of a balanced modulator as shown in FIG. 8 in accordance with one aspect of the present invention. FIG. 10a corresponds to a modulator wherein the digital-to-analog converter 814 has a pulse (return to zero) output with Δ=T/2. FIG. 10a shows a fundamental 1004, first harmonic sidebands 1006 and 1008, and a second harmonic sideband 1010. The sinc function is clearly visible in the noise 1001 (between the sidebands) and the first null can be seen above the second harmonic sideband 1010. The sideband 1006 is only about 5 dB below the fundamental 1004.

Figure 10B:
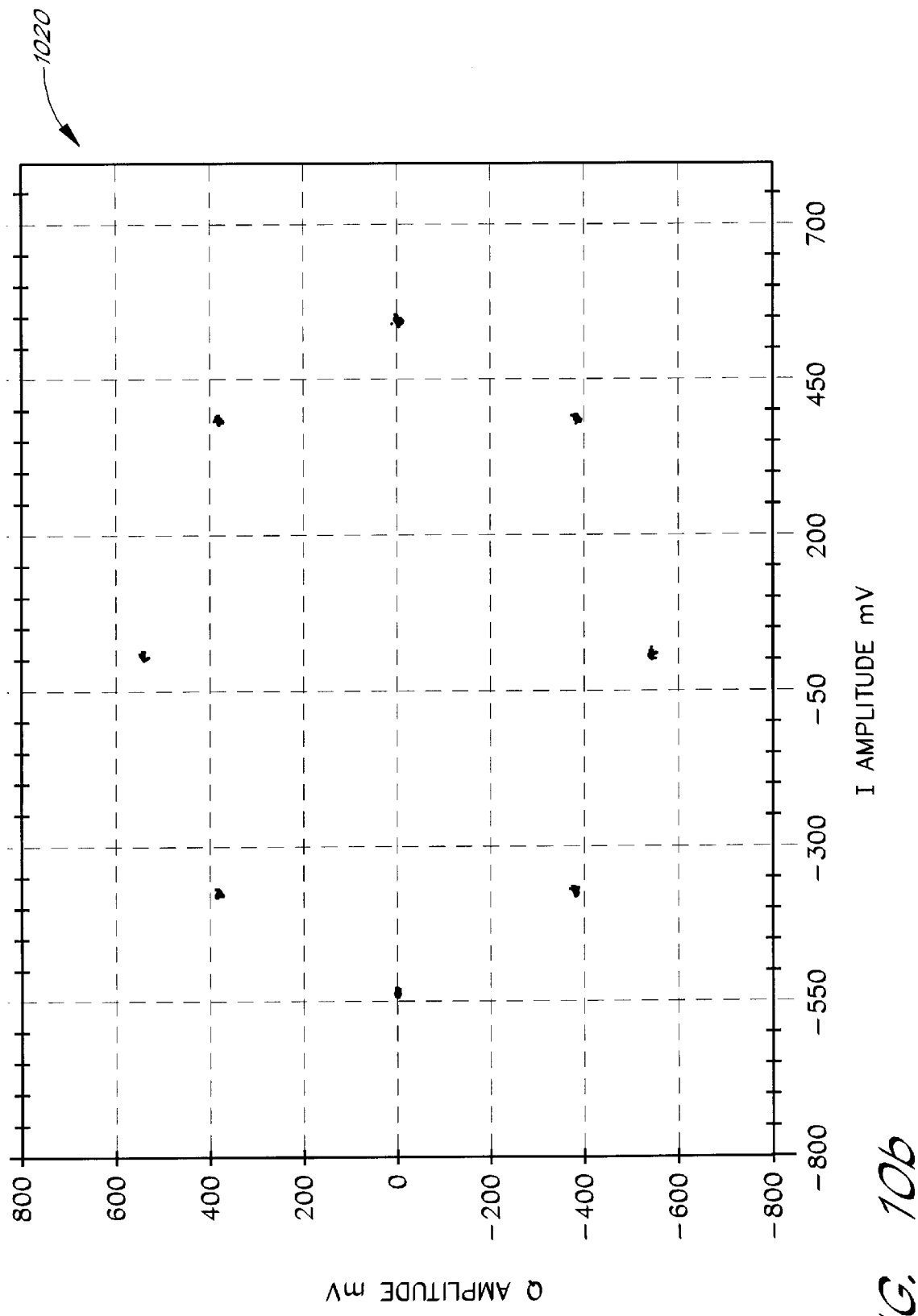
FIG. 10b is an I/Q constellation diagram of the modulated signal produced by an output of the balanced modulator as shown in FIG. 8.

FIG. 10b is an I/Q constellation diagram of the modulated signal produced by an output of the balanced modulator corresponding to FIG. 10a. The constellation in FIG. 10b shows eight data states and an error (scatter) of only about 2%.

Comparing FIG. 9b to FIG. 10b shows that the return-to-zero output used in FIG. 10b reduces the modulation error as evidenced by the small scatter in the I/Q constellation. Moreover, comparing FIG. 9a to Figure lOa shows that the return-to-zero output used in FIG. 10a reduces the amplitude distortions caused by the sinc effect and the amplitude of the desired signal 1006 is less attenuated than the amplitude of the signal 906.

Although described above in connection with particular embodiments of the present invention, it should be understood the descriptions of the embodiments are illustrative of the invention and are not intended to be limiting. Various modifications and applications may occur to those skilled in the art without departing from the true spirit and scope of the invention as defined in the appended claims.

What is claimed is:

1. A balanced modulator, comprising:
    a first input configured to receive a first digital value;
    a second input configured to receive a second digital value;
    a first multiplier configured to multiply said first digital value by a first digital oscillator value to produce a first result;
    a second multiplier configured to multiply said second digital value by a second digital oscillator value to produce a second result;
    an adder configured to add said first result and said second result to produce a digital sum value; and
    an output configured to provide a first output voltage for a first time period and a second output voltage for a second time period , said first output voltage related to said digital sum value, said second output voltage unrelated to said digital sum value, said first time period corresponding to a sine function having a first null occurring a frequency close to or higher than approximately twice a pulse repetition frequency of said first time period.

2. The balanced modulator of claim 1, wherein said second output voltage is substantially zero volts.

3. The balanced modulator of claim 1, wherein said second output voltage is a fixed voltage.

4. The balanced modulator of claim 1, wherein said first time period is substantially the same as said second time period.

5. The balanced modulator of claim 1, wherein said output is configured to provide a third output voltage for a third time period and said second output voltage for a fourth time period, said third output voltage related to a second digital sum value.

6. The balanced modulator of claim 1, further comprising a bandpass filter operatively coupled to said output, said bandpass filter configured to pass a frequency band related to a harmonic of a sample period of said digital-to-analog converter, said bandpass filter having a passband lower in frequency than a frequency of said first null.

7. A method for reducing modulation error when converting a sequence of digital values representing a modulated signal to an analog signal at an intermediate frequency, comprising:

> converting a digital value to an analog value;
>
> providing said analog value to a bandpass filter for a first time period; said bandpass filter having a center frequency corresponding to a desired intermediate frequency, said harmonic being lower in frequency than a frequency of a first null of a sine function corresponding to said first time period, said harmonic corresponding to a portion of said sinc function that exhibits a relatively uniform frequency characteristic; and
>
> providing a fixed analog value to said filter for a second time period.

8. The method of claim 7, wherein said fixed analog value is substantially zero.

9. A telecommunications device comprising a modulator, said modulator comprising an output configured to produce a sequence of output pulses corresponding to a sequence of digital values, said sequence of digital values having a sample period, each of said output pulses corresponding to one of said digital values, each of said output pulses having a pulse width less than said sample period, said modulator further comprising a bandpass filter configured to receive said sequence of output pulses, said bandpass filter configured to pass frequencies corresponding to a harmonic of said sample period, said harmonic lower in frequency than a first null of a sinc function corresponding to said sample period.

10. A balanced modulator, comprising:

> a first input configured to receive a sequence of first digital values, each of said first digital values corresponding to a sample period;
>
> a second input configured to receive a sequence of second digital values, each of said second digital values corresponding to a sample period;
>
> an output configured to produce a sequence of output pulses, each of said output pulses corresponding to one of said first digital values and one of said second digital values, each of said pulses having a pulse width less than said sample period; and
>
> a bandpass filter configured to receive said sequence of output pulses, said bandpass filter configured to pass frequencies corresponding to a harmonic of said sample period, said harmonic lower in frequency than a first null of a sinc envelope corresponding to said sample period.

* * * * *

UNITED STATES PATENT AND TRADEMARK OFFICE
CERTIFICATE OF CORRECTION

PATENT NO. : 6,268,818 B1
DATED : July 31, 2001
INVENTOR(S) : Weizhuang Xin and Ganning Yang It is certified that error appears in the above-identified patent and that said Letters Patent is hereby corrected as shown below:

Column 12,
Line 62, change "a sine function" to -- a sinc function --.

Column 13,
Line 26, change "a sine function" to -- a sinc function --.

Signed and Sealed this

Seventh Day of May, 2002

Attest:

JAMES E. ROGAN
Attesting Officer   Director of the United States Patent and Trademark Office

UNITED STATES PATENT AND TRADEMARK OFFICE
CERTIFICATE OF CORRECTION

PATENT NO. : 6,268,873 B1
DATED : July 31, 2001
INVENTOR(S) : Satoru Ouchi

It is certified that error appears in the above-identified patent and that said Letters Patent is hereby corrected as shown below:

<u>Title page,</u>
Insert the following:
-- [73] Assignee: NAMCO LTD., Tokyo, (JP) --

Signed and Sealed this

Seventh Day of May, 2002

Attest:

JAMES E. ROGAN
*Attesting Officer*   *Director of the United States Patent and Trademark Office*

UNITED STATES PATENT AND TRADEMARK OFFICE
CERTIFICATE OF CORRECTION

PATENT NO. : 6,268,818 B1
DATED : July 31, 2001
INVENTOR(S) : Weizhuang Xin and Ganning Yang It is certified that error appears in the above-identified patent and that said Letters Patent is hereby corrected as shown below:

Column 12,
Line 62, change "a sine function" to -- a sinc function --.

Column 13,
Line 26, change "a sine function" to -- a sinc function --.

This certificate supersedes Certificate of Correction issued May 7, 2002

Signed and Sealed this

Eleventh Day of June, 2002

*Attest:*

JAMES E. ROGAN
*Attesting Officer*     Director of the United States Patent and Trademark Office